United States Patent [19]

Kimata

[11] Patent Number: 4,577,233
[45] Date of Patent: Mar. 18, 1986

[54] SOLID IMAGE-PICKUP DEVICE

[75] Inventor: Masafumi Kimata, Hyogo, Japan

[73] Assignee: Mitsubishi Denki Kabushiki Kaisha, Tokyo, Japan

[21] Appl. No.: 500,198

[22] Filed: Jun. 1, 1983

[30] Foreign Application Priority Data

Jun. 1, 1982 [JP] Japan .................. 57-95443

[51] Int. Cl.⁴ ............................................. H04N 3/14
[52] U.S. Cl. ...................... 358/213; 358/212
[58] Field of Search .............. 358/212, 213, 209, 44, 358/48; 357/24 LR; 250/578

[56] References Cited

U.S. PATENT DOCUMENTS

| | | | |
|---|---|---|---|
| 4,032,903 | 6/1977 | Weimer | 340/173 R |
| 4,169,273 | 9/1979 | Hendrickson | 358/213 |
| 4,319,279 | 3/1982 | Bergen et al. | 358/213 |
| 4,322,753 | 3/1982 | Ishihara | 358/213 |
| 4,369,469 | 1/1983 | Endo et al. | 358/213 |
| 4,392,154 | 7/1983 | Hurii | 358/44 |

Primary Examiner—Gene Z. Rubinson
Assistant Examiner—Robert G. Lev
Attorney, Agent, or Firm—Sughrue, Mion, Zinn, Macpeak & Seas

[57] ABSTRACT

A solid image-pickup device having a scanning mechanism for reading and outputting outputs from photo-detectors. The scanning mechanism includes at least one charge transferring unit in which a plurality of MOS gates are arranged side by side. A MOS gate control unit applies signals to the plurality of MOS gates so as to form potential wells below all the gates of the charge transferring unit at a first period, to inject a signal charge from a photo-detector in the potential well across a transfer gate beneath the MOS gates at a second period, and causes the potential wells to successively be removed in the direction of the charge transfer. As a result, the signal charges below the MOS gates of the charge transferring unit are moved during a third period.

6 Claims, 12 Drawing Figures

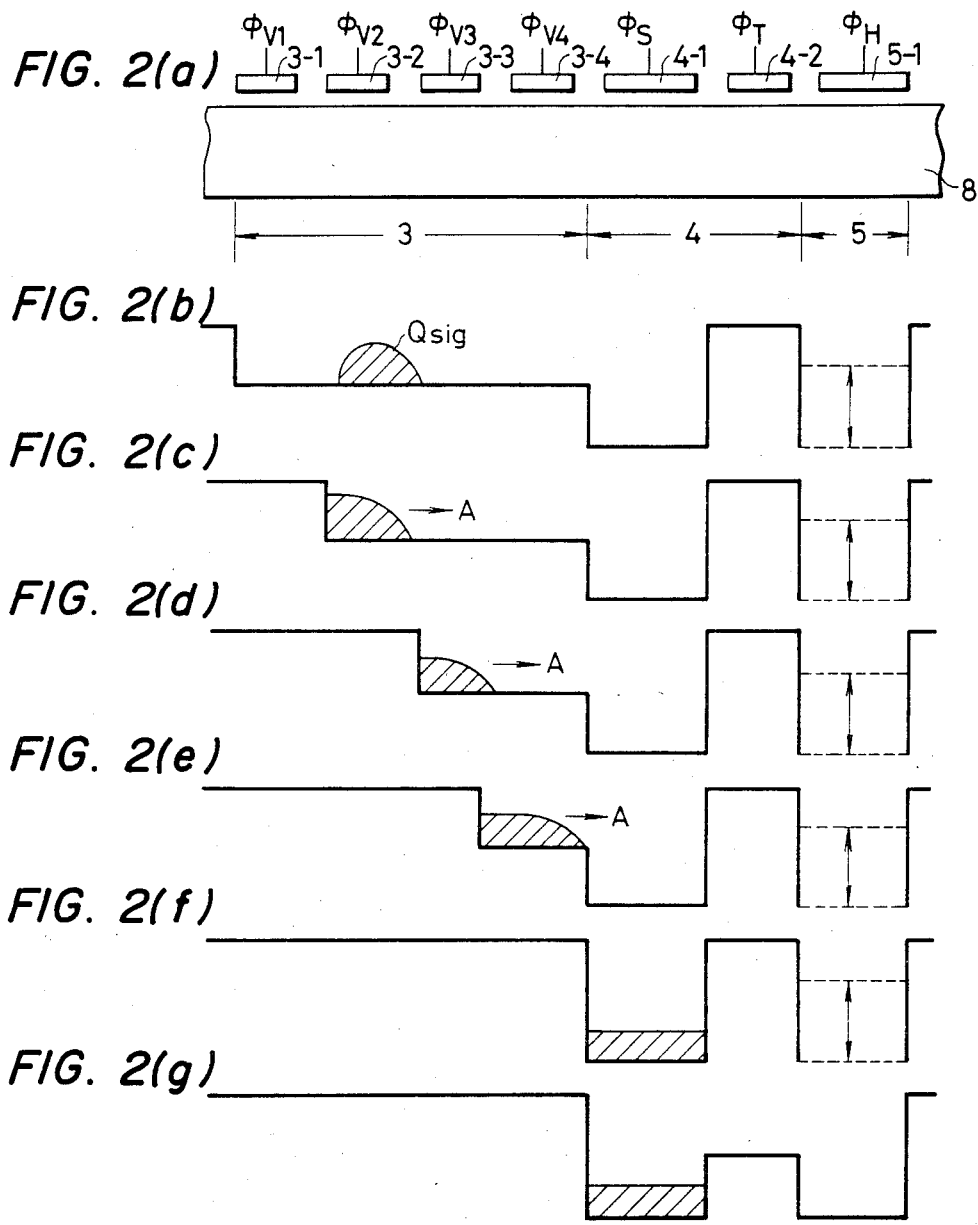

SOLID IMAGE-PICKUP DEVICE

BACKGROUND OF THE INVENTION

This invention relates to a two-dimensional solid image-pickup device the specific feature of which resides in the reading of signals.

In general, a solid image-pickup element is provided by forming photo-detectors and a scanning mechanism on a semiconductor material such as a silicon substrate, and it can sense images in the frequency range of from visible rays to infrared rays. The solid image-pickup element is small in size, small in weight and high in reliability, when compared with the conventional image-pickup tube. Furthermore, in manufacturing the element, the number of points to be adjusted is very small. Therefore, many industrial users are interested in the solid image-pickup element.

The scanning mechanism of the solid image-pickup device mainly employs MOS switches or charge coupled devices (hereinafter referred to merely as "CCD's", when applicable). In the noise former scanning mechanism, the spikes, which are caused when the MOS switches are operated to read signals, are mixed with the signals, thus lowering the S/N ratio. The noise spikes differ according to the reading lines, which forms a so-called "fixed pattern noise", thus further lowering the S/N ratio. Accordingly, the former scanning mechanism is not applicable to the case where weak signals should be detected with a high S/N ratio. On the other hand, in the latter scanning mechanism, especially in the interline CCD system which is widely used because photo-detectors can be freely selected similarly as in the aforementioned MOS system, the CCD's are arranged between the lines of detectors. Accordingly, in order to increase the effective areas of the detectors, it is desired that the area of the CCD section is as small as possible. On the other hand, the CCD's charge transferring capability is proportional to an accumulated gate area per stage of CCD's. Accordingly, decreasing the area of the CCD section means that the maximum amount of charge handled is limited. These are serious problems in detecting a small signal in a large background, as in the case of an infrared solid image-pickup element.

SUMMARY OF THE INVENTION

In view of the foregoing, an object of this invention is to provide a solid image-pickup device wherein at least one of scanning mechanism of the solid image-pickup device comprise a charge transferring unit in which a plurality of MOS gates are arranged side by side so designed as to transfer signal charge in the charge transferring unit so that no spike noise is caused and a large amount of signal charge can be handled.

BRIEF DESCRIPTION OF THE DRAWINGS

FIG. 2a is a sectional view taken along line A—A' in FIG. 1.

FIGS. 2b through 2j are potential diagrams for a description of the operation of the device of the invention;

DETAILED DESCRIPTION OF THE PREFERRED EMBODIMENT

Figure 1:
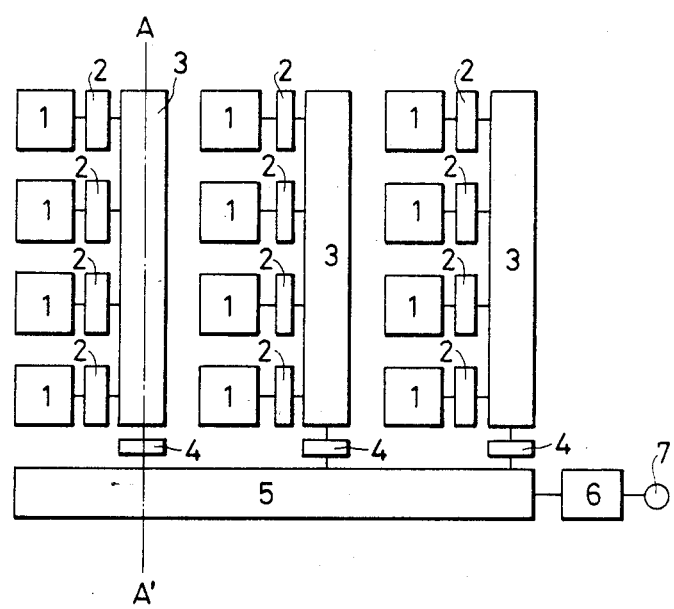
FIG. 1 is a block diagram of the device according to the present invention.

One example of a solid image-pickup device according to this invention will be described with reference to the accompanying drawings. FIG. 1 is a block diagram of the solid image-pickup device which is in the form of a 3×4 array for simplification in description. In FIG. 1, reference numeral 1 designates photo-detectors arranged two-dimensionally on a semiconductor substrate; 2, transfer gates made up of MOS transistors formed on the substrate; 3, vertical charge transfer mechanisms formed on the semiconductor substrate; 4, interface units between the vertical mechanisms 3 and a horizontal CCD 5 formed on the semiconductor substrate; and 6, an output preamplifier with an output terminal 7.

In the solid image-pickup device thus organized, the horizontal CCD 5 and the output preamplifier 6 are completely the same as those in the conventional device. That is, the device of the invention is different in elements for transferring charges vertically, namely, the vertical charge transferring mechanisms 3 and the interface units 4. The structures and operations of these elements will be described with reference to FIGS. 2 and 3.

FIG. 2a is a sectional view taken along line A—A' in FIG. 1. The vertical charge transferring mechanism 3 is made up of four gate electrodes 3-1, 3-2, 3-3 and 3-4, the interface unit 4 is made up of two gate electrodes 4-1 and 4-2, and the end of the interface unit 4 is close to one gate electrode 5-1 of the horizontal CCD 5. In FIG. 2a, reference numeral 8 designates the semiconductor substrate. A channel is formed below each gate, and it may be a surface channel or a buried channel. In FIG. 2a, the gate electrodes are spaced away from one another; however, a multi-layer structure may be applied to formation of these electrodes in such a manner that these electrodes are overlapped. Clock signals $\phi_{V1}$, $\phi_{V2}$, $\phi_{V3}$, $\phi_{V4}$, $\phi_S$, $\phi_T$ and $\phi_H$ are applied to the gate electrodes 3-1 through 3-4, 4-1, 4-2 and 5-1, respectively. This is in the case of N-channels; the polarity of the clock signals should be changed in the case of P-channels.

Figure 2H:
Figure 2I:
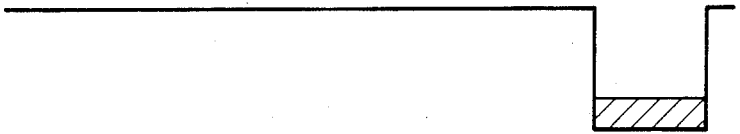
Figure 2J:
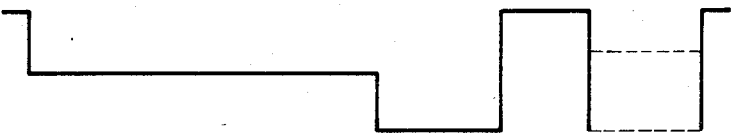
Figure 3:
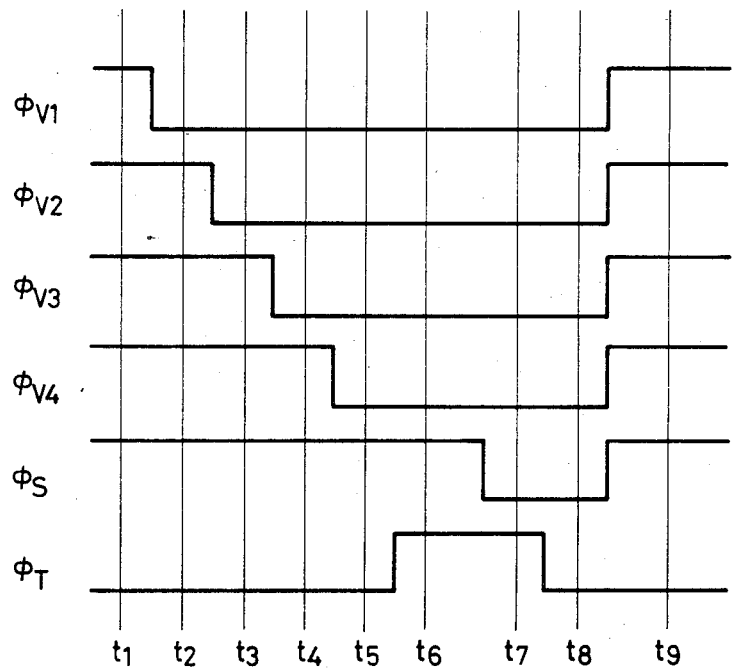
FIG. 3 is a time chart for a description of the operations of clock signals.

The vertical charge transferring of the element shown in the FIG. 2a will be described with reference to FIG. 2b through 2j. FIG. 2b shows the potentials of the element at the time instant $t_1$ in FIG. 3. At this time instant, the clock signals $\phi_{V1}$ through $\phi_{V4}$ are all at a high level, and therefore a large potential well is formed below the gates 3-1 through 3-4. Furthermore, the level of the clock signal $\phi_S$ is higher than that of the clock signals $\phi_{V1}$ through $\phi_{V4}$, and therefore a deeper potential well is formed below the gate 4-1 of the interlace unit 4. On the other hand, as the clock signal $\phi_T$ is at a low level, a shallow potential well is formed below the gate 4-2 of the interlace unit 4. In this case, the horizontal CCD 5 is transferring charges, and the potential is changed up and down as indicated by the dotted line in FIG. 2. When, under this condition, any one of the vertically arranged transfer gates 3-1–3-4 is turned on to input the content of the corresponding detector 1 into the vertical charging transferring mechanism 3, signal charge Qsig is set in place below the gates 3-1 through 3-4. At the time instant $t_2$ in FIG. 3, i.e., when the clock signal $\phi_{V1}$ is set to the low level, the signal charge Qsig is pushed in the direction of the arrow A while spatially spreading because the potential below the gate 3-1 is raised, as shown in FIG. 2c. Furthermore, at the time instants $t_3$, $t_4$ and $t_5$, the clock signals $\phi_{V2}$, $\phi_{V3}$ and $\phi_{V4}$ are set to the low level, respectively, as shown in FIG. 3, and the potentials below the gates 3-2, 3-3 and 3-4 are successively raised while the signal charge Qsig is pushed in the direction of the arrow A, as shown in FIG. 2d, 2e, and 2f. When the clock signal $\phi_{V4}$ is set to the low level, the signal charge Qsig is stored in the potential well beneath the gate 4-1 of the interlace unit 4. The gate 4-1 should have a capacity large enough to store the signal charge Qsig; however, when the clock signal $\phi_S$ is at the high level, it is not always necessary that the potential is higher than that below the gates 3-1 through 3-4, i.e., the former may be equal to the latter in magnitude. After one horizontal line scanning of the horizontal CCD has been accomplished with the signal charge Qsig collected from the gate 4-1, at the time instant $t_6$ in FIG. 3 the clock signal $\phi_H$ to the gate 5-3 of the horizontal 5 is raised to the high level while the clock signal $\phi_T$ to the gate 4-2 is raised to the high level. As a result, the potentials below the gates are as shown in FIG. 2g. In this operation, the potential below the gate 4-2 is made higher than those below the gates 4-1 and 5-1; however, it is not always required to do so; i.e., the former may be at the same level as the latter. At the time instant $t_7$ in FIG. 3, clock signal $\phi_S$ is set to the low level and the potential below the gate 4-1 is raised as shown in FIG. 2h, as a result of which the signal charge Qsig is moved into the potential well below the gate 5-1 of the CCD 5. Thereafter, at the time instant $t_8$ in FIG. 3, the clock signal $\phi_T$ is set to the low level and the potential below the gate 4-2 is raised as shown in FIG. 2i, as a result of which the signal charges Qsig are transferred by the horizontal CCD 5. That is, the horizontal CCD 5 receives the signal (which is the signal charge Qsig) and transfers it to the output preamplifier 6. When the signal is thus transferred to the horizontal CCD 5, i,e., at the time instant $t_9$ in FIG. 3 the clock signals $\phi_{V1}$ through $\phi_{V4}$ and $\phi_S$ are raised to the high levels again; that is, the same condition as that at the time instant $t_1$ is obtained, so that the above-described operation cycle is carried out again.

The operation of the device has been described with reference to the case where the content of one detector in one vertical charge transferring mechanism is read out; however, it should be noted that the same operations are simultaneously carried out in all the vertical charge transferring mechanisms.

Accordingly, similarly as in the conventional CCD system, charges are transferred through potential wells. Therefore, unlike the MOS system, no spike noise is caused. The amount of signal charges handled is determined from the potential well, for one vertical line, of the vertical charge transferring mechanism 3 in the invention. Accordingly, the quantity of signal charge can be considerably large, and can be sufficiently large even when the vertical signal line forming channel width is decreased. In the device of the invention, the gate 4-1 and the horizontal CCD may be formed outside of the array of detectors 1. Accordingly, the limitation of size is reduced as much, and therefore the vertical charge transferring mechanisms 3 and the horizontal CCD 5 can be readily increased in size according to the necessary amount of charges. In the above-described device, the vertical charge transferring mechanism 3 is scanned during a single horizontal period. Usually, the charges being transferred through the vertical charge transferring mechanism 3 for a period of time which is about one frame time maximum. That is, the vertical scanning by the vertical charge mechanism 3 is completed within the duration of a horizontal period, which is typically the time required for forming a single line in the horizontal direction for a cathode-ray tube. As a result the time in which the signal charges Qsig stay in the channel is reduced. Accordingly, channel leakage current and smear can be decreased.

In the above-described device, the vertical charge transferring mechanism 3 has four gates 3-1 through 3-4; however, the invention is not limited thereto or thereby. That is, the same effect can be obtained with a plurality of gates; however, the size of each gate and the number of gates should be determined by taking transfer efficiency into consideration. In the above-described device, the channel of the vertical charge transferring mechanism 3 are of the N-type; however, it may be of the P-type. Furthermore, in the above-described device, the gates of the vertical charge transferring mechanism 3 and the transfer gates are individually provided. However, if three-valued clock signals are employed as in the case of the conventional CCD system, each gate of the vertical charge transferring mechanism 3 and the corresponding transfer gate may be modified into one common gate.

In the solid image-pickup device having a scanning mechanism for reading the outputs of the photo-detectors, according to the invention at least one of the means for forming the scanning mechanism comprises the charge transferring unit in which a plurality of MOS gates are arranged side by side and a MOS gate control unit for applying signal to the MOS gates, so that signal charges are moved below the MOS gates of the charge transferring unit. Accordingly, no spike noise is caused, and a large amount of signal charges can be handled.

What is claimed is:

1. A solid image-pickup device having a scanning mechanism for reading and outputting outputs from photo-detectors comprising:
   at least one means, forming said scanning mechanism, comprising a charge transferring unit in which a plurality of MOS gates are arranged side by side, and a MOS gate control unit for applying signals to said plurality of MOS gates so as to form potential wells below all said gates of said charge transferring unit at a first period, to inject a signal charge into said potential well at a second period, and to successively remove said potential wells in a direction of said charge transferring so as to move said signal charges below said MOS gates of said charge transferring unit at a third period.

2. A solid image-pickup device as claimed in claim 1, wherein a channel is formed below said MOS gate.

3. A solid image-pickup device as claimed in claim 1, wherein a channel is a surface channel.

4. A solid image-pickup device as claimed in claim 1, wherein a channel is a buried channel below said MOS gate.

5. A solid image-pickup device as claimed in claim 1, wherein said charge transferring unit is employed as vertical transferring unit.

6. A solid image-pickup device having a scanning mechanism for reading and outputting outputs from photo-detectors comprising,
   a charge transferring unit, as a vertical signal transferring portion of said scanning mechanism, including a plurality of MOS gates arranged side by side and a MOS gate control unit for applying signals to said plurality of MOS gates so as to form potential wells below all said gates of said charge transferring unit at a first period, to inject a signal from said photodetectors into said potential well at a second period, and to successively remove said potential wells in a direction of said charge transferring so as to move said signal charges below said MOS gates of said charge transferring unit at a third period, a charge-coupled-device, as a horizontal charge transferring portion of said scanning mechanism, for outputting said signal charge from said vertical charge transferring unit, and at least two MOS gates connecting said charge transferring unit to said charge-coupled-device.

* * * * *